(12) United States Patent
Duan et al.

(10) Patent No.: US 11,830,881 B2
(45) Date of Patent: Nov. 28, 2023

(54) ARRAY SUBSTRATE, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventors: Miao Duan, Guangdong (CN); Dongze Li, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 432 days.

(21) Appl. No.: 17/056,011

(22) PCT Filed: Oct. 27, 2020

(86) PCT No.: PCT/CN2020/123865
§ 371 (c)(1),
(2) Date: Nov. 17, 2020

(87) PCT Pub. No.: WO2022/047950
PCT Pub. Date: Mar. 10, 2022

(65) Prior Publication Data
US 2022/0077198 A1    Mar. 10, 2022

(30) Foreign Application Priority Data
Sep. 4, 2020    (CN) .......................... 202010920285.6

(51) Int. Cl.
*H01L 27/12*    (2006.01)
*H01L 29/772*    (2006.01)
(Continued)

(52) U.S. Cl.
CPC ...... *H01L 27/1225* (2013.01); *H01L 27/1248* (2013.01); *H01L 27/1262* (2013.01);
(Continued)

(58) Field of Classification Search
CPC ............. H01L 27/1225; H01L 27/1248; H01L 27/1262; H01L 29/78633; H01L 29/7869;
(Continued)

(56) References Cited

U.S. PATENT DOCUMENTS 9,997,586 B2 * 6/2018 Kim ...................... H10K 59/131
11,114,630 B2 * 9/2021 Li .......................... H10K 71/00
(Continued)

FOREIGN PATENT DOCUMENTS

CN    105374845 A    3/2016
CN    107170762 A    9/2017
(Continued)

OTHER PUBLICATIONS

International Search Report in International application No. PCT/CN2020/123865, dated Jun. 3, 2021.
(Continued)

*Primary Examiner* — Nikolay K Yushin
(74) *Attorney, Agent, or Firm* — PV IP PC; Wei Te Chung; Zhigang Ma (57) ABSTRACT

An array substrate, a manufacturing method thereof, and a display panel are provided. The array substrate includes at least one anti-radiation layer including a light incident side and a light-emitting side. The light-emitting side is positioned adjacent to an oxide semiconductor layer, the light incident side is configured to allow high energy light waves to enter the anti-radiation layer, the anti-radiation layer is configured to convert the high energy light waves into visible light, and the light-emitting side is configured to allow the visible light to enter the oxide semiconductor
(Continued)

layer, thereby improving light stability of oxide semiconductors.

16 Claims, 3 Drawing Sheets

(51) Int. Cl.
    *G02F 1/1368*     (2006.01)
    *G02F 1/1362*     (2006.01)
    *H10K 59/126*     (2023.01)

(52) U.S. Cl.
    CPC .... *G02F 1/13685* (2021.01); *G02F 1/136209* (2013.01); *H10K 59/126* (2023.02)

(58) Field of Classification Search
    CPC . H01L 29/785; H01L 29/772; G02F 1/13685; G02F 1/136209; G02F 1/1368; G02F 1/133614; H10K 59/126; H10K 59/12; H10K 59/131; H10K 59/10
    See application file for complete search history.

(56) References Cited

U.S. PATENT DOCUMENTS

| | | | |
|---|---|---|---|
| 2017/0125506 A1* | 5/2017 | Kim | ............... H01L 29/78633 |
| 2018/0005600 A1 | 1/2018 | Ikeda | |
| 2020/0028025 A1 | 1/2020 | Yang | |
| 2020/0235321 A1* | 7/2020 | Li | ..................... H10K 71/00 |

FOREIGN PATENT DOCUMENTS

| | | |
|---|---|---|
| CN | 109148709 A | 1/2019 |
| CN | 109613747 A | 4/2019 |
| CN | 109728067 A | 5/2019 |
| CN | 111697006 A | 9/2020 |
| JP | 2003131261 A | 5/2003 |

OTHER PUBLICATIONS

Written Opinion of the International Search Authority in International application No. PCT/CN2020/123865, dated Jun. 3, 2021.
Chinese Office Action issued in corresponding Chinese Patent Application No. 202010920285.6 dated Oct. 12, 2022, pp. 1-12.

* cited by examiner

ARRAY SUBSTRATE, MANUFACTURING METHOD THEREOF, AND DISPLAY PANEL

FIELD OF INVENTION

The present disclosure relates to the field of display technologies, and more particularly, to an array substrate, a manufacturing method thereof, and a display panel.

BACKGROUND OF INVENTION

Thin film transistor technology is one of core technologies of tablet displays. Both liquid crystal displays (LCDs) and organic light-emitting diode (OLED) semiconductor display devices require TFT backboards for driving. Since amorphous silicon (α-Si) materials have low mobility, it is difficult to meet a need of large-sized and high-resolution displays in the future. Although low temperature polysilicon (LTPS) materials have relatively high mobility, they have shortcomings of high cost, poor uniformity, and difficulty to achieve large areas. Therefore, metal oxides having high mobility represented by indium gallium zinc oxide (IGZO) applied on the TFT backboards have a very important meaning.

However, high energy photons (such as ultraviolet light) in external light can excite IGZO to generate electron-hole pairs or oxygen vacancies, which will generate free electrons and cause threshold voltages to have "negative drift", thereby causing IGZO to have poor light stability.

In summary, it is necessary to provide a new array substrate, a manufacturing method thereof, and a display panel to solve the above technical problems.

Technical problem: since external high energy photons can excite IGZO to generate the electron-hole pairs or the oxygen vacancies, which will generate the free electrons and cause the threshold voltages to have "negative drift", thereby causing IGZO to have poor light stability in current technology, an array substrate, a manufacturing method thereof, and a display panel provided in the present disclosure are to solve the technical problems.

SUMMARY OF INVENTION

In order to solve the above problems, the present disclosure provides technical solutions as follows.

An embodiment of the present disclosure provides an array substrate. The array substrate includes:
a substrate;
a thin film transistor array layer disposed on the substrate and including an oxide semiconductor layer; and
at least one anti-radiation layer including a light incident side and a light-emitting side positioned opposite to each other, wherein the light-emitting side is positioned adjacent to the oxide semiconductor layer, the light incident side is configured to allow high energy light waves to enter the anti-radiation layer, the anti-radiation layer is configured to convert the high energy light waves into visible light, and the light-emitting side is configured to allow the visible light to enter the oxide semiconductor layer.

According to the array substrate provided in an embodiment of the present disclosure, the anti-radiation layer is disposed on one side of the substrate away from the thin film transistor array layer, the light incident side is one side of the anti-radiation layer away from the substrate, and the light-emitting side is another side of the anti-radiation layer adjacent to the substrate.

According to the array substrate provided in an embodiment of the present disclosure, the thin film transistor array layer further includes:
a light-shielding layer disposed on the substrate;
a buffer layer covering the substrate and the light-shielding layer, wherein the oxide semiconductor layer is disposed on the buffer layer;
a gate insulating layer disposed on the oxide semiconductor layer;
a gate electrode layer disposed on the gate insulating layer;
an interlayer dielectric layer covering the buffer layer, the oxide semiconductor layer, the gate insulating layer, and the gate electrode layer, and including a first through-hole, a second through-hole, and a third through-hole;
a source electrode and a drain electrode disposed on the interlayer dielectric layer, wherein the source electrode is connected to the light-shielding layer by the second through-hole and connected to the oxide semiconductor layer by the third through-hole, and the drain electrode is connected to the oxide semiconductor layer by the first through-hole; and
a passivation layer covering the interlayer dielectric layer, the source electrode, and the drain electrode.

According to the array substrate provided in an embodiment of the present disclosure, the anti-radiation layer is disposed on one side of the passivation layer away from the substrate, the light incident side is one side of the anti-radiation layer away from the substrate, and the light-emitting side is another side of the anti-radiation layer adjacent to the substrate.

According to the array substrate provided in an embodiment of the present disclosure, the anti-radiation layer is disposed on one side of the substrate adjacent to the thin film transistor array layer, and the light-shielding layer is disposed on one side of the anti-radiation layer away from the substrate.

According to the array substrate provided in an embodiment of the present disclosure, the high energy light waves include ultraviolet light.

According to the array substrate provided in an embodiment of the present disclosure, the anti-radiation layer includes an anti-radiation resin including a down-conversion material, a resin, fluorine-containing monomers or fluorine-containing polymers, a UV initiator, and a solvent; and
wherein mass percentages of the down-conversion material, the resin, the fluorine-containing monomers or the fluorine-containing polymers, the UV initiator, and the solvent in the anti-radiation resin respectively range from 0.1% to 5%, 50% to 90%, 1% to 20%, 1% to 5%, and 20% to 40%.

According to the array substrate provided in an embodiment of the present disclosure, a material of the oxide semiconductor layer is indium gallium zinc oxide (IGZO).

According to the array substrate provided in an embodiment of the present disclosure, a thickness of the anti-radiation layer ranges from 1 um to 10 um.

An embodiment of the present disclosure provides a display panel, including an array substrate and being a liquid crystal display panel or an organic light-emitting diode display panel;
wherein the array substrate includes:
a substrate;
a thin film transistor array layer disposed on the substrate and including an oxide semiconductor layer; and
at least one anti-radiation layer including a light incident side and a light-emitting side positioned opposite to each other, wherein the light-emitting side is positioned adjacent to the oxide semiconductor layer, the light incident side is configured to allow high energy light waves to enter the anti-radiation layer, the anti-radiation layer is configured to convert the high energy light waves into visible light, and the light-emitting side is configured to allow the visible light to enter the oxide semiconductor layer.

According to the display panel provided in an embodiment of the present disclosure, the anti-radiation layer is disposed on one side of the substrate away from the thin film transistor array layer, the light incident side is one side of the anti-radiation layer away from the substrate, and the light-emitting side is another side of the anti-radiation layer adjacent to the substrate.

According to the display panel provided in an embodiment of the present disclosure, the thin film transistor array layer further includes:

- a light-shielding layer disposed on the substrate;
- a buffer layer covering the substrate and the light-shielding layer, wherein the oxide semiconductor layer is disposed on the buffer layer;
- a gate insulating layer disposed on the oxide semiconductor layer;
- a gate electrode layer disposed on the gate insulating layer;
- an interlayer dielectric layer covering the buffer layer, the oxide semiconductor layer, the gate insulating layer, and the gate electrode layer, and including a first through-hole, a second through-hole, and a third through-hole;
- a source electrode and a drain electrode disposed on the interlayer dielectric layer, wherein the source electrode is connected to the light-shielding layer by the second through-hole and connected to the oxide semiconductor layer by the third through-hole, and the drain electrode is connected to the oxide semiconductor layer by the first through-hole; and
- a passivation layer covering the interlayer dielectric layer, the source electrode, and the drain electrode.

According to the display panel provided in an embodiment of the present disclosure, the anti-radiation layer is disposed on one side of the passivation layer away from the substrate, the light incident side is one side of the anti-radiation layer away from the substrate, and the light-emitting side is another side of the anti-radiation layer adjacent to the substrate.

According to the display panel provided in an embodiment of the present disclosure, the anti-radiation layer is disposed on one side of the substrate adjacent to the thin film transistor array layer, and the light-shielding layer is disposed on one side of the anti-radiation layer away from the substrate.

According to the display panel provided in an embodiment of the present disclosure, the high energy light waves include ultraviolet light.

According to the display panel provided in an embodiment of the present disclosure, the anti-radiation layer includes an anti-radiation resin including a down-conversion material, a resin, fluorine-containing monomers or fluorine-containing polymers, a UV initiator, and a solvent; and wherein mass percentages of the down-conversion material, the resin, the fluorine-containing monomers or fluorine-containing polymers, the UV initiator, and the solvent in the anti-radiation resin respectively range from 0.1% to 5%, 50% to 90%, 1% to 20%, 1% to 5%, and 20% to 40%.

According to the display panel provided in an embodiment of the present disclosure, a material of the oxide semiconductor layer is indium gallium zinc oxide (IGZO).

According to the display panel provided in an embodiment of the present disclosure, a thickness of the anti-radiation layer ranges from 1 um to 10 um.

According to the display panel provided in an embodiment of the present disclosure, the array substrate includes two or more of the anti-radiation layer.

An embodiment of the present disclosure provides a manufacturing method of an array substrate. The method includes following steps:

S10: providing a substrate and forming a thin film transistor array layer on the substrate; and S20: preparing an anti-radiation resin, coating the anti-radiation resin on the substrate or the thin film transistor array layer, and curing under a UV lamp to form the array substrate having an anti-radiation layer.

Beneficial effect: beneficial effects of the present disclosure are that the array substrate, the manufacturing method thereof, and the display panel provided in the present disclosure dispose at least one anti-radiation layer having down-conversion function on the array substrate, wherein, the anti-radiation layer can absorb high energy rays in external light and convert them into visible light having low energy, making them unable to reach energy required to excite the oxide semiconductor layer to generate electron-hole pairs or oxygen vacancies, thereby preventing oxide semiconductors (such as IGZO) from being damaged and improving light stability of the oxide semiconductor layer.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings.

Since external high energy photons can excite IGZO to generate electron-hole pairs or oxygen vacancies, which will generate free electrons and cause threshold voltages to have "negative drift", thereby causing IGZO to have poor light stability in array substrates, manufacturing methods thereof, and display panels of current technology, an embodiment of the present disclosure can solve the defect.

Figure 1:
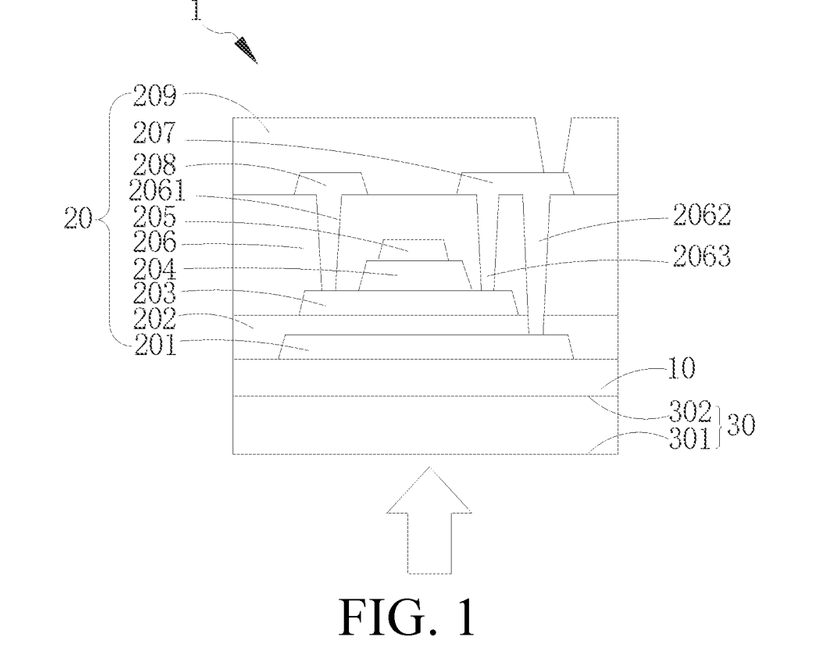
FIG. 1 is a schematic cross-sectional structural diagram of a first array substrate according to an embodiment of the present disclosure.

Referring to FIG. 1, an embodiment of the present disclosure provides an array substrate 1. The array substrate 1 includes a substrate 10, a thin film transistor array layer 20, and at least one anti-radiation layer 30.

The substrate 10 may be one of a glass substrate, a quartz substrate, or a resin substrate. The thin film transistor array layer 20 is disposed on the substrate 10 and includes an oxide semiconductor layer 203, and a material of the oxide semiconductor layer 203 may be IGZO.

The anti-radiation layer 30 includes a light incident side 301 and a light-emitting side 302 positioned opposite to each other. The light-emitting side 302 is positioned adjacent to the oxide semiconductor layer 203, the light incident side 301 is configured to allow high energy light waves to enter the anti-radiation layer 30, the anti-radiation layer 30 is configured to convert the high energy light waves into visible light, and the light-emitting side 302 is configured to allow the visible light to enter the oxide semiconductor layer 203. That is, when external light irradiates the array substrate 1, the external light will enter inside the anti-radiation layer 30 from the light incident side 301 and emit outside the anti-radiation layer 30 from the light-emitting side 302. The external light includes the high energy light waves. Since the anti-radiation layer 30 provided in the embodiment of the present disclosure has down-conversion function, which can convert the high energy light waves entering the anti-radiation layer 30 from the light incident side 301 into the visible light, the visible light enters the oxide semiconductor layer 203 from the light-emitting side 302. The visible light has lower energy, which cannot reach energy required to excite the oxide semiconductor layer 203 to generate electron-hole pairs or oxygen vacancies, and hence cannot generate free electrons, so it can prevent the high energy light waves from having negative impact on the oxide semiconductor layer 203, thereby improving light stability of the oxide semiconductor layer 203 and extending a service life of the array substrate 1.

It should be noted that the high energy light waves affecting stability of the oxide semiconductor layer 203 include ultraviolet light. In fact, light waves having energy greater than the ultraviolet light can cause the oxide semiconductor layer 203 to be unstable, for example, X-ray. In general, the array substrate 1 is rarely exposed to high energy rays in normal application environments, so the ultraviolet light in sunlight is a main component to cause influences. Therefore, in the embodiment of the present disclosure, the high energy light waves being the ultraviolet light is taken as an example for description, but it does not mean that the anti-radiation layer 30 provided in the embodiment of the present disclosure cannot resist radiation of high energy rays other than the ultraviolet light.

Specifically, the thin film transistor array layer 20 also includes a light-shielding layer 201, a buffer layer 202, a gate insulating layer 204, a gate electrode layer 205, an interlayer dielectric layer 206, a source electrode 207, a drain electrode 208, and a passivation layer 209.

The light-shielding layer 201 is disposed on the substrate 10 and configured to reduce light leakage, thereby realizing light shielding. The buffer layer 202 covers the substrate 10 and the light-shielding layer 201 and has buffer and protection effects, and the oxide semiconductor layer 203 is disposed on the buffer layer 202. The gate insulating layer 204 is disposed on the oxide semiconductor layer 203, and the gate electrode layer 205 is disposed on the gate insulating layer 204. The interlayer dielectric layer 206 covers the buffer layer 202, the oxide semiconductor layer 203, the gate insulating layer 204, and the gate electrode layer 205, and is configured to insulate and protect the gate electrode layer 205. The interlayer dielectric layer 206 includes a first through-hole 2061, a second through-hole 2062, and a third through-hole 2063. The source electrode 207 and the drain electrode 208 are disposed on the interlayer dielectric layer 206. The source electrode 207 is connected to the light-shielding layer 201 by the second through-hole 2062 and connected to the oxide semiconductor layer 203 by the third through-hole 2063, and the drain electrode 208 is connected to the oxide semiconductor layer 203 by the first through-hole 2061. The passivation layer 209 covers the interlayer dielectric layer 206, the source electrode 207, and the drain electrode 208, and is configured to protect the source electrode 207 and the drain electrode 208.

A specific disposed position of the anti-radiation layer 30 may be designed according to an irradiating direction of the external light. For example, when the external light irradiates from bottom to top, the anti-radiation layer 30 may be disposed in a film layer structure positioned under the oxide semiconductor layer 203. When the external light irradiates from top to bottom, the anti-radiation layer 30 may be disposed in a film layer structure positioned on the oxide semiconductor layer 203.

In an embodiment, referring to FIG. 1, when the external light irradiates from bottom to top, the anti-radiation layer 30 is disposed on one side of the substrate 10 away from the thin film transistor array layer 20, the light incident side 301 is one side of the anti-radiation layer 30 away from the substrate 10, and the light-emitting side 302 is another side of the anti-radiation layer 30 adjacent to the substrate 10. The ultraviolet light of the external light passes through the anti-radiation layer 30, the substrate 10, and the oxide semiconductor layer 203 in sequence.

Figure 2:
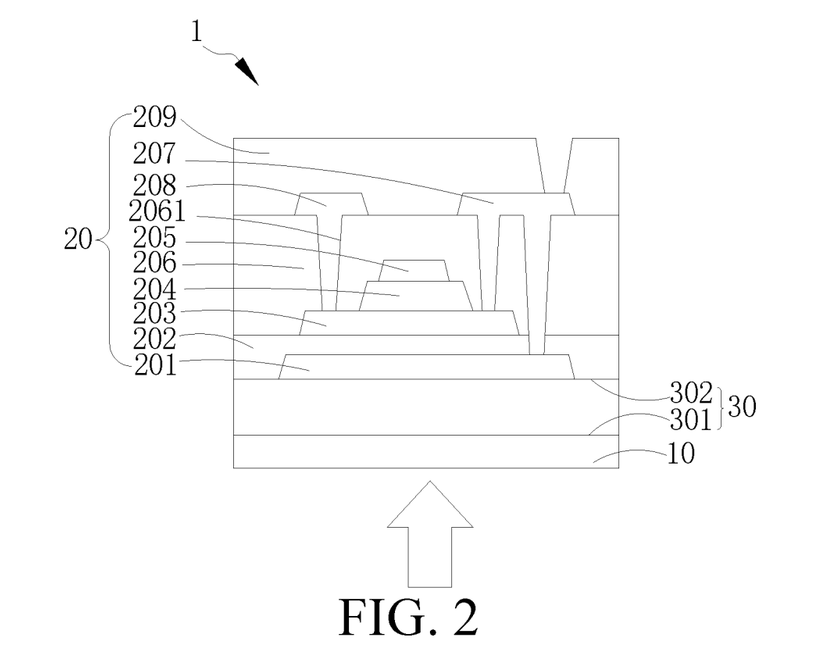
FIG. 2 is a schematic cross-sectional structural diagram of a second array substrate according to an embodiment of the present disclosure.

In another embodiment, referring to FIG. 2, a difference between FIG. 2 and FIG. 1 is that in FIG. 2, the anti-radiation layer 30 is disposed on one side of the substrate 10 adjacent to the thin film transistor array layer 20, the light-shielding layer 201 is disposed on the anti-radiation layer 30, the light incident side 301 is the side of the anti-radiation layer 30 adjacent to the substrate 10, and the light-emitting side 302 is the side of the anti-radiation layer 30 away from the substrate 10. The ultraviolet light of the external light passes through the substrate 10, the anti-radiation layer 30, and the oxide semiconductor layer 203 in sequence.

Figure 3:
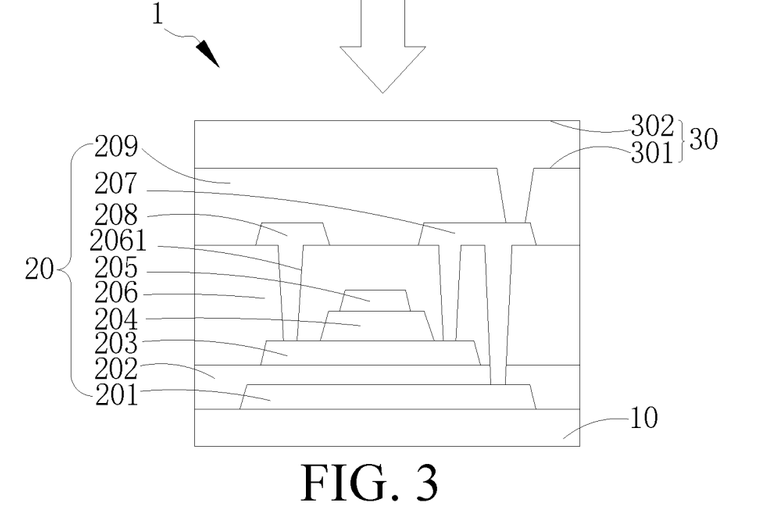
FIG. 3 is a schematic cross-sectional structural diagram of a third array substrate according to an embodiment of the present disclosure.

In an embodiment, when the external light irradiates from top to bottom, please refer to FIG. 3. A difference between FIG. 3 and FIG. 1 is that in FIG. 3, the anti-radiation layer 30 is disposed on one side of the passivation layer 209 away from the substrate 10, the light incident side 301 is the side of the anti-radiation layer 30 away from the substrate 10, and the light-emitting side 302 is the side of the anti-radiation layer 30 adjacent to the substrate 10. The ultraviolet light of the external light passes through the anti-radiation layer 30, the oxide semiconductor layer 203, and the substrate 10 in sequence. At this time, the anti-radiation layer 30 can be used as a planarization layer of the thin film transistor array layer 20, which is beneficial to reduce entire thickness of the array substrate 1.

Figure 4:
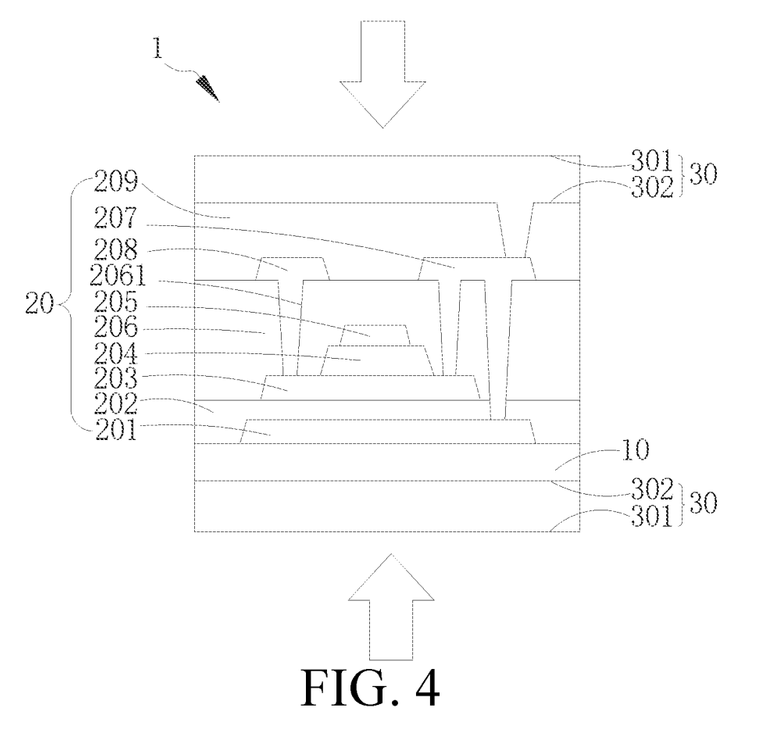
FIG. 4 is a schematic cross-sectional structural diagram of a fourth array substrate according to an embodiment of the present disclosure.

In the above embodiments, the array substrate 1 includes a single anti-radiation layer 30. Further, the array substrate 1 may also include two anti-radiation layers 30 or multiple anti-radiation layers 30. For example, referring to FIG. 4, a difference between FIG. 4 and FIG. 1 is that in FIG. 4, the array substrate 1 includes the two anti-radiation layers 30. Wherein, one of the anti-radiation layers 30 is disposed on the side of the substrate 10 away from the thin film transistor array layer 20, and another one of the anti-radiation layers 30 is disposed on the side of the passivation layer 209 away from the thin film transistor array layer 20. The two anti-radiation layers 30 adopted can resist the ultraviolet light from multiple directions, thereby having better radiation resistances.

It should be noted that regarding the specific disposed position of the anti-radiation layer 30, the embodiments of the present disclosure only list a few cases, and other cases adopting the concepts of the present disclosure that are not listed are also within the protection scope of the present disclosure.

Specifically, a thickness of the anti-radiation layer 30 ranges from 1 um to 10 um.

Specifically, the anti-radiation layer 30 is formed by curing an anti-radiation resin. Main components of the anti-radiation resin include a down-conversion material, a resin, fluorine-containing monomers or fluorine-containing polymers, a UV initiator, and a solvent. Wherein, mass percentages of the down-conversion material, the resin, the fluorine-containing monomers or the fluorine-containing polymers, the UV initiator, and the solvent in the anti-radiation resin respectively range from 0.1% to 5%, 50% to 90%, 1% to 20%, 1% to 5%, and 20% to 40%. The anti-radiation resin prepared according to the above formula can effectively resist radiation of the ultraviolet light.

The down-conversion material is used to convert the ultraviolet light into the visible light or photons having lower energy. The down-conversion material may be an organic dye, such as Lumogen F Violet 570, or may be an inorganic dye containing metal elements. The resin is used as a carrier, and may be an unsaturated polyester, an olefin, or a diene, such as an acrylic resin. The fluorine-containing monomers or fluorine-containing polymers are polymers containing fluorine and have waterproof and moisture resistant effects. The UV initiator is used to crosslink and cure unsaturated polymers or initiate photo polymerization of monomers or oligomers. The UV initiator may be Irgacure-1173. The solvent is used to dissolve polymers and may be organic solvents such as toluene or chloroform.

Figure 5:
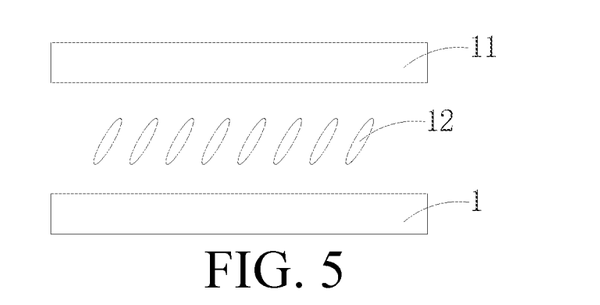
FIG. 5 is a schematic cross-sectional structural diagram of a display panel according to an embodiment of the present disclosure.
Figure 6:
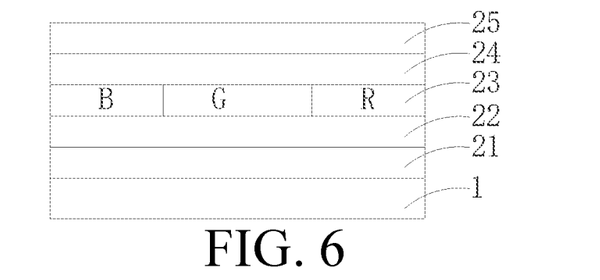
FIG. 6 is a schematic cross-sectional structural diagram of another display panel according to an embodiment of the present disclosure.

An embodiment of the present disclosure further provides a display panel, including the array substrate 1 in the above embodiments. The display panel may be a liquid crystal display panel or an organic light-emitting diode display panel. Referring to FIG. 5, the display panel is the liquid crystal display panel and further includes a color filter substrate 11 disposed opposite to the array substrate 1 and a liquid crystal layer 12 disposed between the array substrate 1 and the color filter substrate 11. Referring to FIG. 6, the display panel is the organic light-emitting diode display panel and further includes a light-emitting device layer disposed on the array substrate 1. The light-emitting device layer is formed by inkjet printing or evaporation process, and includes an anode, a hole injection layer 21, a hole transport layer 22, a light-emitting layer 23, an electron transport layer 24, and an electron injection layer 25 stacked in sequence. The light-emitting layer includes a red light-emitting layer, a green light-emitting layer, and a blue light-emitting layer.

Figure 7:
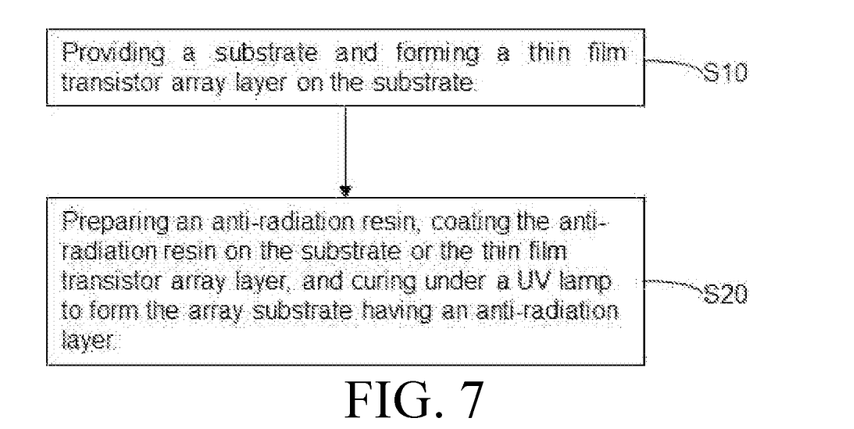
FIG. 7 is a flowchart of a manufacturing method of an array substrate according to an embodiment of the present disclosure.

Referring to FIG. 7, an embodiment of the present disclosure further provides a manufacturing method of the array substrate 1. The method includes following steps:

S10: providing the substrate 10 and forming the thin film transistor array layer 20 on the substrate 10.

Specifically, forming the thin film transistor array layer 20 on the substrate 10 includes depositing and patterning on the substrate 10 to form the light-shielding layer 201, depositing on the substrate 10 and the light-shielding layer 201 to form the buffer layer 202, depositing and patterning on the buffer layer 202 to form the oxide semiconductor layer 203, depositing on the oxide semiconductor layer 203 to form the gate insulating layer 204, depositing and patterning on the gate insulating layer 204 to form the gate electrode layer 205, depositing on the buffer layer 202, the oxide semiconductor layer 203, the gate insulating layer 204, and the gate electrode layer 205 to form the interlayer dielectric layer 206, and etching the interlayer dielectric layer 206 to form the first through-hole 2061, the second through-hole 2062, and the third through-hole 2063. The source electrode 207 and the drain electrode 208 are formed by depositing and patterning on the interlayer dielectric layer 206. The source electrode 207 is connected to the light-shielding layer 201 by the second through-hole 2062 and connected to the oxide semiconductor layer 203 by the third through-hole 2063, and the drain electrode 208 is connected to the oxide semiconductor layer 203 by the first through-hole 2061. The passivation layer 209 is formed by depositing on the interlayer dielectric layer 206, the source electrode 207, and the drain electrode 208.

S20: preparing the anti-radiation resin, coating the anti-radiation resin on the substrate 10 or the thin film transistor array layer 20, and curing under a UV lamp to form the array substrate 1 having the anti-radiation layer 30.

Specifically, the anti-radiation resin is prepared according to a determined formula. The formula includes components such as the down-conversion material, the resin, the fluorine-containing monomers or fluorine-containing polymers, the UV initiator, and the solvent. Wherein, the mass percentages of the down-conversion material, the resin, the fluorine-containing monomers or the fluorine-containing polymers, the UV initiator, and the solvent in the anti-radiation resin respectively range from 0.1% to 5%, 50% to 90%, 1% to 20%, 1% to 5%, and 20% to 40%. The anti-radiation layer 30 formed by curing can effectively absorb and resist the ultraviolet light in the external light.

The anti-radiation resin may be coated on the side of the substrate 10 away from the thin film transistor array layer by slit coating, or the anti-radiation resin may be coated on the side of the substrate 10 adjacent to the thin film transistor array layer 20, or the anti-radiation resin may be coated on the side of the passivation layer 209 away from the substrate 10.

It should be noted that after the anti-radiation layer 30 is manufactured and the array substrate 1 is applied to the liquid crystal display panel, subsequent processes include processes such as manufacturing of the color filter substrate, liquid crystal coating, cell formation, module assembling, and polarizer attachment. When the array substrate 1 is applied to the organic light-emitting diode display panel, subsequent processes include forming the light-emitting device layer on the manufactured array substrate 1, and the light-emitting device layer can be formed by inkjet printing or evaporation process.

Beneficial effects are that the array substrate, the manufacturing method thereof, and the display panel provided in the present disclosure dispose at least one anti-radiation layer having down-conversion function on the array substrate, wherein, the anti-radiation layer can absorb high energy rays in external light and convert them into visible light having low energy, making them unable to reach energy required to excite the oxide semiconductor layer to generate electron-hole pairs or oxygen vacancies, thereby preventing oxide semiconductors (such as IGZO) from being damaged and improving light stability of the oxide semiconductor layer.

The present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. An array substrate, comprising:
   a substrate;
   a thin film transistor array layer disposed on the substrate and comprising an oxide semiconductor layer; and
   at least one anti-radiation layer comprising a light incident side and a light-emitting side positioned opposite to each other, wherein the light-emitting side is positioned adjacent to the oxide semiconductor layer, the light incident side is configured to allow high energy light waves to enter the anti-radiation layer, the anti-radiation layer is configured to convert the high energy light waves into visible light, and the light-emitting side is configured to allow the visible light to enter the oxide semiconductor layer;
   wherein the high energy light waves comprise ultraviolet light;
   wherein the anti-radiation layer comprises an anti-radiation resin comprising a down-conversion material, a resin, fluorine-containing monomers or fluorine-containing polymers, a UV initiator, and a solvent; and
   wherein mass percentages of the down-conversion material, the resin, the fluorine-containing monomers or the fluorine-containing polymers, the UV initiator, and the solvent in the anti-radiation resin respectively range from 0.1% to 5%, 50% to 90%, 1% to 20%, 1% to 5%, and 20% to 40%.

2. The array substrate according to claim 1, wherein the anti-radiation layer is disposed on one side of the substrate away from the thin film transistor array layer, the light incident side is one side of the anti-radiation layer away from the substrate, and the light-emitting side is another side of the anti-radiation layer adjacent to the substrate.

3. The array substrate according to claim 1, wherein a material of the oxide semiconductor layer is indium gallium zinc oxide (IGZO).

4. The array substrate according to claim 1, wherein a thickness of the anti-radiation layer ranges from 1 um to 10 um.

5. The array substrate according to claim 1, wherein the thin film transistor array layer further comprises:

a light-shielding layer disposed on the substrate;
   a buffer layer covering the substrate and the light-shielding layer, wherein the oxide semiconductor layer is disposed on the buffer layer;
   a gate insulating layer disposed on the oxide semiconductor layer;
   a gate electrode layer disposed on the gate insulating layer;
   an interlayer dielectric layer covering the buffer layer, the oxide semiconductor layer, the gate insulating layer, and the gate electrode layer, and comprising a first through-hole, a second through-hole, and a third through-hole;
   a source electrode and a drain electrode disposed on the interlayer dielectric layer, wherein the source electrode is connected to the light-shielding layer by the second through-hole and connected to the oxide semiconductor layer by the third through-hole, and the drain electrode is connected to the oxide semiconductor layer by the first through-hole; and
   a passivation layer covering the interlayer dielectric layer, the source electrode, and the drain electrode.

6. The array substrate according to claim 5, wherein the anti-radiation layer is disposed on one side of the passivation layer away from the substrate, the light incident side is one side of the anti-radiation layer away from the substrate, and the light-emitting side is another side of the anti-radiation layer adjacent to the substrate.

7. The array substrate according to claim 5, wherein the anti-radiation layer is disposed on one side of the substrate adjacent to the thin film transistor array layer, and the light-shielding layer is disposed on one side of the anti-radiation layer away from the substrate.

8. A display panel, comprising an array substrate and being a liquid crystal display panel or an organic light-emitting diode display panel;
   wherein the array substrate comprises:
   a substrate;
   a thin film transistor array layer disposed on the substrate and comprising an oxide semiconductor layer; and
   at least one anti-radiation layer comprising a light incident side and a light-emitting side positioned opposite to each other, wherein the light-emitting side is positioned adjacent to the oxide semiconductor layer, the light incident side is configured to allow high energy light waves to enter the anti-radiation layer, the anti-radiation layer is configured to convert the high energy light waves into visible light, and the light-emitting side is configured to allow the visible light to enter the oxide semiconductor layer;
   wherein the high energy light waves comprise ultraviolet light;
   wherein the anti-radiation layer comprises an anti-radiation resin comprising a down-conversion material, a resin, fluorine-containing monomers or fluorine-containing polymers, a UV initiator, and a solvent; and
   wherein mass percentages of the down-conversion material, the resin, the fluorine-containing monomers or the fluorine-containing polymers, the UV initiator, and the solvent in the anti-radiation resin respectively range from 0.1% to 5%, 50% to 90%, 1% to 20%, 1% to 5%, and 20% to 40%.

9. The display panel according to claim 8, wherein the anti-radiation layer is disposed on one side of the substrate away from the thin film transistor array layer, the light incident side is one side of the anti-radiation layer away from the substrate, and the light-emitting side is another side of the anti-radiation layer adjacent to the substrate.

10. The display panel according to claim 8, wherein a material of the oxide semiconductor layer is indium gallium zinc oxide (IGZO).

11. The display panel according to claim 8, wherein a thickness of the anti-radiation layer ranges from 1 um to 10 um.

12. The display panel according to claim 8, wherein the array substrate comprises two or more of the anti-radiation layer.

13. The display panel according to claim 8, wherein the thin film transistor array layer further comprises:
 a light-shielding layer disposed on the substrate;
 a buffer layer covering the substrate and the light-shielding layer, wherein the oxide semiconductor layer is disposed on the buffer layer;
 a gate insulating layer disposed on the oxide semiconductor layer;
 a gate electrode layer disposed on the gate insulating layer;
 an interlayer dielectric layer covering the buffer layer, the oxide semiconductor layer, the gate insulating layer, and the gate electrode layer, and comprising a first through-hole, a second through-hole, and a third through-hole;
 a source electrode and a drain electrode disposed on the interlayer dielectric layer, wherein the source electrode is connected to the light-shielding layer by the second through-hole and connected to the oxide semiconductor layer by the third through-hole, and the drain electrode is connected to the oxide semiconductor layer by the first through-hole; and
 a passivation layer covering the interlayer dielectric layer, the source electrode, and the drain electrode.

14. The display panel according to claim 13, wherein the anti-radiation layer is disposed on one side of the passivation layer away from the substrate, the light incident side is one side of the anti-radiation layer away from the substrate, and the light-emitting side is another side of the anti-radiation layer adjacent to the substrate.

15. The display panel according to claim 13, wherein the anti-radiation layer is disposed on one side of the substrate adjacent to the thin film transistor array layer, and the light-shielding layer is disposed on one side of the anti-radiation layer away from the substrate.

16. A manufacturing method of an array substrate, comprising following steps:
 S10: providing a substrate and forming a thin film transistor array layer on the substrate; and
 S20: preparing an anti-radiation resin, coating the anti-radiation resin on the substrate or the thin film transistor array layer, and curing under a UV lamp to form the array substrate having an anti-radiation layer.

* * * * *